US006902866B1

(12) United States Patent
Teng

(10) Patent No.: US 6,902,866 B1
(45) Date of Patent: Jun. 7, 2005

(54) THERMOSENSITIVE LITHOGRAPHIC PRINTING PLATE COMPRISING SPECIFIC ACRYLATE MONOMERS

(76) Inventor: Gary Ganghui Teng, 10 Kendall Dr., Northborough, MA (US) 01532

( * ) Notice: Subject to any disclaimer, the term of this patent is extended or adjusted under 35 U.S.C. 154(b) by 0 days.

(21) Appl. No.: 10/720,882

(22) Filed: Nov. 24, 2003

(51) Int. Cl.[7] .................................................. G03F 7/30

(52) U.S. Cl. ................. 430/302; 430/271.1; 430/284.1; 430/309; 430/434; 430/435; 430/494

(58) Field of Search ........................... 430/270.1, 271.1, 430/273.1, 281.1, 284.1, 285.1, 286.1, 287.1, 288.1, 302, 309, 434, 435, 494

(56) References Cited

U.S. PATENT DOCUMENTS

| | | | | | |
|---|---|---|---|---|---|
| 5,496,903 | A | * | 3/1996 | Watanabe et al. | 526/204 |
| 6,014,929 | A | | 1/2000 | Teng | 101/456 |
| 6,153,356 | A | | 11/2000 | Urano et al. | 430/281.1 |
| 6,232,038 | B1 | | 5/2001 | Takasaki et al. | 430/281.1 |
| 6,309,792 | B1 | | 10/2001 | Hauck et al. | 430/270.1 |
| 6,475,700 | B1 | * | 11/2002 | Higashi et al. | 430/278.1 |
| 6,482,571 | B1 | | 11/2002 | Teng | 430/302 |
| 6,541,183 | B2 | | 4/2003 | Teng | 430/303 |
| 6,576,401 | B2 | | 6/2003 | Teng | 430/303 |
| 6,727,044 | B1 | * | 4/2004 | Fujimaki et al. | 430/284.1 |
| 6,797,449 | B2 | * | 9/2004 | Nakamura et al. | 430/160 |
| 2002/0160295 | A1 | * | 10/2002 | Aoshima et al. | 430/176 |
| 2002/0197564 | A1 | | 12/2002 | Timpe et al. | 430/284.1 |
| 2003/0215744 | A1 | * | 11/2003 | Gries | 430/273.1 |
| 2004/0170922 | A1 | * | 9/2004 | Goto | 430/273.1 |

* cited by examiner

*Primary Examiner*—Barbara L. Gilliam

(57) ABSTRACT

Negative thermosensitive lithographic printing plates comprise on a hydrophilic substrate an oleophilic thermosensitive layer comprising a polymeric binder, urethane (meth) acrylate monomer having at least 6 (meth)acrylate groups, a non-urethane (meth)acrylate monomer having at least 4 (meth)acrylate groups, a free-radical initiator, and an infrared absorbing dye; wherein the weight ratio of said urethane (meth)acrylate monomer to said non-urethane (meth) acrylate monomer is from 0.10 to 3.0, and said thermosensitive layer is capable of hardening upon exposure to an infrared radiation. Lithographic plates with such compositions have excellent press durability.

24 Claims, No Drawings

THERMOSENSITIVE LITHOGRAPHIC PRINTING PLATE COMPRISING SPECIFIC ACRYLATE MONOMERS

FIELD OF THE INVENTION

This invention relates to lithographic printing plates. More particularly, it relates to negative thermosensitive lithographic printing plates comprising a multifunctional urethane (meth)acrylate monomer and a multifunctional non-urethane (meth)acrylate monomer at a weight ratio of from 0.10 to 3.0.

BACKGROUND OF THE INVENTION

Lithographic printing plates (after process) generally consist of ink-receptive areas (image areas) and ink-repelling areas (non-image areas). During printing operation, an ink is preferentially received in the image areas, not in the non-image areas, and then transferred to the surface of a material upon which the image is to be produced. Commonly the ink is transferred to an intermediate material called printing blanket, which in turn transfers the ink to the surface of the material upon which the image is to be produced.

At the present time, lithographic printing plates (processed) are generally prepared from lithographic printing plate precursors (also commonly called lithographic printing plates) comprising a substrate and a photosensitive coating deposited on the substrate, the substrate and the photosensitive coating having opposite surface properties. The photosensitive coating is usually a photosensitive material, which solubilizes or hardens upon exposure to an actinic radiation. In positive-working systems, the exposed areas become more soluble and can be developed to reveal the underneath substrate. In negative-working systems, the exposed areas become hardened and the non-exposed areas can be developed to reveal the underneath substrate.

Currently, most commercial lithographic plates require a development process after the plates being exposed and before put on press. A liquid developer is used to dissolve and clean off the non-exposed areas (for negative plate) or the exposed areas (for positive plate). On-press developable lithographic printing plates have been disclosed in the literature. Such plates can be directly mounted on press after exposure to develop with ink and/or fountain solution during the initial printing operation and then to print out regular printed sheets. No separate development process before mounting on press is needed, allowing savings on labor, material, and developer waste disposal costs. Among the on-press developable lithographic printing plates are U.S. Pat. Nos. 5,258,263, 5,407,764, 5,516,620, 5,561,029, 5,616,449, 5,677,110, 5,811,220, 6,014,929, and 6,482,571.

Traditionally the plate is exposed with an actinic light (usually an ultraviolet light from a lamp) through a separate photomask having predetermined image pattern that is placed between the light source and the plate. Laser sources have been increasingly used to imagewise expose a printing plate that is sensitized to a corresponding laser, allowing the elimination of photomask, reducing material, equipment and labor cost. Among the laser imagable plates, infrared laser sensitive plates, also called thermosensitive plates or thermal plates, are most attractive because they often can be handled under white light.

Negative thermosensitive lithographic printing plates having on a substrate a thermosensitive layer comprising a polymeric binder, an ethylenically unsaturated monomer, an initiator, and an infrared absorbing dye have been described in the literature, such as U.S. Pat. Nos. 4,997,745, 6,153,356, 6,232,038, 6,309,792, and 6,645,697. As the ethylenically unsaturated monomer, multifunctional (meth)acrylate monomer is generally used, including urethane (meth) acrylate monomers and non-urethane (meth)acrylate monomers. Urethane (meth)acrylate monomers generally give better curing speed and press durability than non-urethane (meth)acrylate monomers. Multifunctional urethane (meth) acrylate monomer has been used either alone (as in U.S. Pat. No. 6,232,038), blended with a multifunctional non-urethane (meth)acrylate monomer at a urethane (meth) acrylate monomer to non-urethane (meth)acrylate monomer weight ratios of at least 3.5 (for example, 3.5 to 4.9 as in U.S. Pat. No. 6,309,792, and 4.0 to 4.8 as in U.S. Pat. App. Pub. No. 2002/0197564), or blended with a difunctional non-urethane (meth)acrylate monomer (such as in U.S. Pat. No. 6,153,356).

The inventor has found, surprisingly, thermosensitive lithographic printing plates comprising a multifunctional urethane (meth)acrylate monomer having at least 6 (meth) acrylate groups and a multifunctional non-urethane (meth) acrylate monomer having at least 4 (meth)acrylate groups at a weight ratio of from 0.10 to 3.0 can give significantly better curing speed and press durability than with such multifunctional urethane (meth)acrylate monomer or such multifunctional non-urethane (meth)acrylate monomer alone.

SUMMARY OF THE INVENTION

This invention provides a negative thermosensitive lithographic printing plate comprising (i) a hydrophilic substrate, (ii) an oleophilic thermosensitive layer comprising a polymeric binder, a urethane (meth)acrylate monomer having at least 6 (meth)acrylate groups, a non-urethane (meth)acrylate monomer having at least 4 (meth)acrylate groups, a free-radical initiator, and an infrared absorbing dye; wherein the weight ratio of said urethane (meth)acrylate monomer to said non-urethane (meth)acrylate monomer is from 0.10 to 3.0, and said thermosensitive layer is capable of hardening upon exposure to an infrared radiation.

This invention further provides a method of imagewise exposing the above lithographic printing plate with an infrared laser to cause hardening of the thermosensitive layer in the exposed areas.

This invention further provides a method of imagewise exposing the above lithographic printing plate with an infrared laser to cause hardening of the thermosensitive layer in the exposed areas and then developing the plate with an aqueous developer.

This invention further provides a method of imagewise exposing the above lithographic printing plate with an infrared laser to cause hardening of the thermosensitive layer in the exposed areas and then developing the plate with ink and/or fountain solution on a lithographic printing press during initial printing operation, wherein the thermosensitive layer is soluble or dispersible in ink and/or fountain solution.

For on-press developable plate, the plate can be imaged off press and then mounted on a lithographic printing press for on-press development with ink and/or fountain solution and lithographic printing. Alternatively, the plate can be imagewise exposed with a laser while mounted on a plate cylinder of a lithographic press, on-press developed on the same plate cylinder with ink and/or fountain solution, and then directly print images to the receiving sheets.

DETAILED DESCRIPTION OF THE PREFERRED EMBODIMENTS

The support employed in the lithographic printing plates of this invention can be any support that provides a hydrophilic surface. Such a support may be a metal sheet, a polymer film, or a coated paper. Aluminum (including aluminum alloys) sheet is a preferred support. Particularly preferred is an aluminum support that has been grained and anodized, with or without further deposition of a hydrophilic barrier layer. Surface graining (or roughening) can be achieved by mechanical graining or brushing, chemical etching, and/or AC electrochemical graining. The roughened surface can be further anodized to form a durable aluminum oxide surface using an acid electrolyte such as sulfuric acid and/or phosphoric acid. The roughened and anodized aluminum surface can be further thermally or electrochemically coated with a layer of silicate or hydrophilic polymer such as polyvinyl phosphonic acid, polyacrylamide, polyacrylic acid, polybasic organic acid, copolymers of vinyl phosphonic acid and acrylamide to form a durable hydrophilic layer. Polyvinyl phosphonic acid and its copolymers are preferred polymers. Processes for coating a hydrophilic barrier layer on aluminum in lithographic printing plate application are well known in the art, and examples can be found in U.S. Pat. Nos. 2,714,066, 4,153,461, 4,399,021, and 5,368,974.

The thermosensitive layer of this invention comprises a polymeric binder, a urethane (meth)acrylate monomer having at least 6 (meth)acrylate groups, a non-urethane (meth) acrylate monomer having at least 4 (meth)acrylate groups, a free-radical initiator, and an infrared absorbing dye; wherein the weight ratio of said urethane (meth)acrylate monomer to said non-urethane (meth)acrylate monomer is from 0.10 to 3.0, and said thermosensitive layer is capable of hardening upon exposure to an infrared laser. The weight ratio of said urethane (meth)acrylate monomer to said non-urethane (meth)acrylate monomer is preferably from 0.15 to 2.0, more preferably from 0.20 to 1.5, and most preferably from 0.30 to 1.0. The monomer to polymer weight ratio is preferably larger than 0.5, more preferably larger than 1.0, and most preferably larger than 1.5. For on-press developable plate, the monomer to polymer weight ratio is preferably larger than 1.5 and more preferably larger than 2.0.

In this patent, the term monomer includes both monomer and oligomer, and the term (meth)acrylate includes acrylate and/or methacrylate (acrylate, methacrylate, or both acrylate and methacrylate). The thermosensitive layer can comprise one or more urethane (methacrylate monomers, one or more non-urethane (meth)acrylate monomers, and one or more polymers. In calculating the weight ratio of the monomer to the polymeric binder, the weight of the monomer includes the total weight of all monomers and the weight of the polymeric binder includes the total weight of all polymeric binders.

The thermosensitive layer preferably has a coverage of 0.2 to 4.0 g/m$^2$, more preferably 0.5 to 2.0 g/m$^2$, and most preferably 0.8 to 1.5 g/m$^2$. The term hardening means becoming insoluble in a developer (negative-working).

The plate may be developed with a liquid developer or developed on press with ink and/or fountain solution to remove the non-hardened areas of the thermosensitive layer. For plate developable with a liquid developer, an aqueous developer is preferred. A preferred aqueous developer is a non-alkaline aqueous developer comprising 60–99% by weight of water and 0.5 to 40% by weight of an alcohol solvent. A second preferred liquid developer is an alkaline aqueous developer (suitable for alkaline developable plate). The alkaline aqueous developable plate preferably comprises alkaline soluble polymeric binder in the thermosensitive layer. In order to be useful for the on-press developable plate of this invention, the thermosensitive layer must be capable of hardening upon exposure to an infrared radiation, and the non-hardened areas of the thermosensitive layer must be soluble or dispersible in ink and/or fountain solution and can be developed off on a lithographic press with ink and/or fountain solution.

The thermosensitive layer of this invention can be solid or semisolid at 25° C. In one embodiment, semisolid thermosensitive layer is preferably used to achieve fast photospeed, and/or developability with ink and/or fountain solution or with an aqueous developer. Here the term semisolid thermosensitive layer is defined as a thermosensitive layer which, when coated on a flat and smooth surface at a thickness of at least 1 micron, is able to form fingerprints when pressed with a finger at a force (or weight) of 2 kg and is tacky to touch by fingers at 25° C.

Polymeric binder for the thermosensitive layer of this invention can be any film-forming polymer. The polymers may or may not have (meth)acrylate groups or other polymerizable double bonds such as allyl groups. Examples of suitable polymers include (meth)acrylic polymers and copolymers (such as polybutylmethacrylate, polyethylmethacrylate, polymethylmethacrylate, polymethylacrylate, butylmethacrylate/methylmethacrylate copolymer, and methylmethacrylate/methylmethacrylic acid copolymer), polyvinyl acetate, polyvinyl butyrate, polyvinyl chloride, styrene/acrylonitrile copolymer, styrene/maleic anhydride copolymer and its partial ester, nitrocellulose, cellulose acetate butyrate, cellulose acetate propionate, vinyl chloride/vinyl acetate copolymer, butadiene/acrylonitrile copolymer, and polyurethane binder. For thermosensitive layer developable with an alkaline aqueous developer, polymer with carboxylic acid groups is preferably used; the acid number is preferably at least 30, more preferably at least 50, and most preferably at least 70 mg KOH/g polymer.

Suitable urethane (meth)acrylate monomers include any compounds having one or more urethane linkage (—NHCOO—) and at least 6 (meth)acrylate groups. Urethane (meth)acrylate monomer is usually formed by reacting a compound having at least two isocyanate groups with a (meth)acrylate compound having a hydroxy group. To achieve 6 or higher functionality, the (meth)acrylate compound with one hydroxy group must have at least 3 (meth) acrylate groups when reacting with a bifunctional isocyante compound, or at least 2 (meth)acrylate groups when reacting with a trifunctional isocyanate compound. Suitable isocyante compounds include, for example, aromatic diisocyanate such as p-phenylene diisocyanate, 2,4-tolylene diisocyanate, 2,6-tolylene diisocyanate, 4,4'-diphenylmethane diisocyanate, naphthalene-1,5-diisocyanate and tolydine diisocyanate; aliphatic diisocyanate such as hexamethylene diisocyanate, lysinemethyl ester diisocyanate, 2,4,4-trimethylhexamethylene diisocyanate and dimer acid diisocyanate; alicyclic diisocyanate such as isophorone diisocyanate, and 4,4'-methylenebis(cyclohexylisocyanate); aliphatic diisocyanate having an aromatic ring, such as xylylene diisocyanate; triisocyanate such as lysine ester triisocyanate, 1,6,11-undecane triisocyanate, 1,8-diisocyanate-4-isocyanatemethyloctane, 1,3,6-hexamethylene triisocyanate, bicycloheptane triisocyanate, tris(isocyanate phenylmethane) and tris(isocyanatephenyl) thiophosphate; and polyisocyanate formed from condensation of three or more diisocyanate compounds such as 2,4-tolylene diisocyanate isocyanurate trimer, 2,4-tolylene diisocyanate-trimethylolpropane adduct, 1,6-hexanediisocyante isocyanurate trimer. Suitable (meth) acrylate compounds with one hydroxy group include pentaerythritol tri(meth)acrylate, dipentaerythritol penta(meth) acrylate, ditrimethylolpropane tri(meth)acrylate and pentaerythritol di(meth)acrylate monostearate. Various urethane (meth)acrylate monomers with six or more (meth) acrylate groups are described in U.S. Pat. No. 6,232,038 and U.S. Pat. Pub. Nos. 2002/0018962, and can be used as the urethane (meth)acrylate monomers of this instant invention. Among the urethane (meth)acrylate monomers, urethane acrylate monomer is preferred.

Suitable non-urethane (meth)acrylate monomers with 4 or more (meth)acrylate groups include any non-urethane (meth)acrylate monomer with 4 or more (meth)acrylate groups, such as pentaerythritol tetra(meth)acrylate, dipentaerythritol penta(meth)acrylate, dipentaerythritol hexa (meth)acrylate, di(trimethylolpropane) tetra(meth)acrylate. Among the non-urethane (meth)acrylate monomers, non-urethane acrylate monomer is preferred.

In addition to the urethane (meth)acrylate monomer with at least 6 (meth)acrylate groups and non-urethane (meth) acrylate monomer with at least 4 (meth)acrylate groups, urethane (meth)acrylate monomer with less than 6 (meth) acrylate groups and/or non-urethane (meth)acrylate monomer with less than 4 (meth)acrylate groups may also be added in the thermosensitive layer with the total amount of such lower functionality monomers being at less than 30% by weight of the total monomers, preferably less than 20%, and more preferably less than 10%.

The free-radical initiators useful in this instant invention can be any compound capable of generating free radicals to cause the polymerization of the (meth)acrylate monomer in the presence of an infrared absorbing dye upon exposure to a laser radiation. Suitable free-radical initiators include, for example, onium salts such as diaryliodonium hexafluoroantimonate, diaryliodonium hexafluorophosphate, diaryliodonium triflate, (4-(2-hydroxytetradecyl-oxy)phenyl)phenyliodonium hexafluoroantimonate, (4-octoxyphenyl)phenyliodonium hexafluoroantimonate, bis(4-t-butylphenyl)iodonium hexafluorophosphate, triarylsulfonium hexafluorophosphate, triarylsulfonium p-toluenesulfonate, (3-phenylpropan-2-onyl) triaryl phosphonium hexafluoroantimonate and N-ethoxy(2-methyl)pyridinium hexafluorophosphate, and the onium salts as described in U.S. Pat. Nos. 5,955,238, 6,037,098 and 5,629,354; borate salts such as tetrabutylammonium triphenyl(n-butyl)borate, tetraethylammonium triphenyl(n-butyl)borate, diphenyliodonium tetraphenylborate, and triphenylsulfonium triphenyl(n-butyl)borate, and the borate salts as described in U.S. Pat. Nos. 6,232,038 and 6,218,076; haloalkyl substituted s-triazines such as 2,4-bis(trichloromethyl)-6-(p-methoxy-styryl)-s-triazine, 2,4-bis(trichloromethyl)-6-(4-methoxy-naphth-1-yl)-s-triazine, 2,4-bis(trichloromethyl)-6-piperonyl-s-triazine, and 2,4-bis(trichloromethyl)-6-[(4-ethoxyethylenoxy)-phen-1-yl]-s-triazine, and the s-triazines as described in U.S. Pat. Nos. 5,955,238, 6,037,098, 6,010,824, and 5,629,354; titanocene such as bis($\eta^9$-2,4-cyclopentadien-1-yl) bis[2,6-difluoro-3-(1H-pyrrol-1-yl) phenyl) titanium; hexaarylbiimidazole compounds such as 2,2'-bis(2-chlorophenyl)-4,4',5,5'-tetraphenyl-1,1'-biimidazole, 2,2'-bis(2-ethoxyphenyl)-4,4',5,5'-tetraphenyl-1,1'-biimidazole, 2-(1-naphthyl)-4,5-diphenyl-1,2'-biimidazole; and derivatives of acetophenone such as 2,2-dimethoxy-2-phenylacetophenone, and 2-methyl-1-[4-(methylthio)phenyl]-2-morpholino propan-1-one. The initiator is added in the thermosensitive layer preferably at 0.1 to 40% by weight of the thermosensitive layer, more preferably 1 to 30%, and most preferably 5 to 20%.

Infrared absorbing dyes useful in the thermosensitive layer of this invention include any infrared absorbing dye effectively absorbing an infrared radiation having a wavelength of 700 to 1,500 nm. It is preferable that the dye having an absorption maximum between the wavelengths of 750 and 1,200 nm. Various infrared absorbing dyes are described in U.S. Pat. Nos. 5,858,604, 5,922,502, 6,022,668, 5,705,309, 6,017,677, and 5,677,106, and in the book entitled "Infrared Absorbing Dyes" edited by Masaru Matsuoka, Plenum Press, New York (1990), and can be used in the thermosensitive layer of this invention. Examples of useful infrared absorbing dyes include squarylium, croconate, cyanine (including polymethine), phthalocyanine (including naphthalocyanine), merocyanine, chalcogenopyryloarylidene, oxyindolizine, quinoid, indolizine, pyrylium and metal dithiolene dyes. Cyanine and phthalocyanine dyes are preferred infrared absorbing dyes. The infrared absorbing dye is added in the thermosensitive layer preferably at 0.01 to 20% by weight of the thermosensitive layer, more preferably at 0.05 to 10%, and most preferably at 0.2 to 5%.

Various surfactants may be added into the thermosensitive layer to allow or enhance the on-press developability with ink and/or fountain solution or developability with an aqueous developer. Both polymeric and small molecule surfactants can be used. However, it is preferred that the surfactant has low or no volatility so that it will not evaporate from the thermosensitive layer of the plate during storage and handling. Nonionic surfactants are preferred. The nonionic surfactant used in this invention should have sufficient portion of hydrophilic segments (or groups) and sufficient portion of oleophilic segments (or groups), so that it is at least partially soluble in water (>1 g surfactant soluble in 100 g water) and at least partially soluble in organic phase (>1 g surfactant soluble in 100 g thermosensitive layer). Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (also called block copolymer of propylene oxide and ethylene oxide); ethoxylated or propoxylated acrylate oligomers; and polyethoxylated alkylphenols and polyethoxylated fatty alcohols. The nonionic surfactant is preferably added at from 0.1 to 30% by weight of the thermosensitive layer, more preferably from 0.5 to 20%, and most preferably from 1 to 15%.

For plates with rough and/or porous surface capable of mechanical interlocking with a coating deposited thereon, a thin water soluble interlayer may be deposited between the substrate and the thermosensitive layer. Here the substrate surface is rough and/or porous enough and the interlayer is thin enough to allow bonding between the thermosensitive layer and the substrate through mechanical interlocking. Such a plate configuration Is described in U.S. Pat. No. 6,014,929, the entire disclosure of which is hereby incorporated by reference. Preferred releasable interlayer comprises a water-soluble polymer. Polyvinyl alcohol (including various water-soluble derivatives of polyvinyl alcohol) is the preferred water-soluble polymer. Usually pure water-soluble polymer is coated. However, one or more surfactant and other additives may be added. The water-soluble polymer is generally coated from an aqueous solution with water as the only solvent. A water-soluble organic solvent, preferably an alcohol such as ethanol or isopropanol, can be added into the water-soluble polymer aqueous coating solution to improve the coatability. The alcohol is preferably added at less than 20% by weight of the solution, more preferably at less than 10%. The releasable interlayer preferably has an average coverage of 1 to 200 $mg/m^2$, more preferably 2 to 100 $mg/m^2$, and most preferably 4 to 40 $mg/m^2$. The substrate preferably has an average surface roughness Ra of 0.2 to 2.0 microns, and more preferably 0.4 to 1.0 microns.

A water soluble or dispersible overcoat can be coated on the thermosensitive layer to, for example, improve the photospeed, surface durability, and/or (for on-press developable plate) on-press developability of the plate. The overcoat preferably comprises a water-soluble polymer, such as polyvinyl alcohol (including various water-soluble derivatives of polyvinyl alcohol). Combination of two or more water-soluble polymers (such as a combination of polyvinyl alcohol and polyvinylpyrrolidone) may also be used. Polyvinyl alcohol is a preferred water-soluble polymer. Various additives, such as surfactant, wetting agent, defoamer, leveling agent and dispersing agent, can be added into the overcoat formulation to facilitate, for example, the coating or development process. Examples of surfactants useful in the overcoat of this invention include polyethylene glycol, polypropylene glycol, and copolymer of ethylene glycol and propylene glycol, polysiloxane surfactants, perfluorocarbon surfactants, alkylphenyl ethylene oxide condensate, sodium dioctylsulfosuccinate, sodium dodecylbenzenesulfonate, and ammonium laurylsulfate. Various organic or inorganic emulsion or dispersion may be added into the overcoat to, for example, reduce the tackiness or moisture sensitivity of the plate. The overcoat preferably has a coverage of from 0.001 to 4.0 $g/m^2$, more preferably from 0.01 to 2.0 $g/m^2$, and most preferably from 0.1 to 1.2 $g/m^2$.

The infrared radiation suitable for exposing the lithographic plate of the instant invention can be from any infrared radiation source suitable for digital imaging. Infrared lasers are preferred infrared radiation sources. Infrared lasers useful for the imagewise exposure of the thermosensitive plates of this invention include laser sources emitting in the near infrared region, i.e. emitting in the wavelength range of from 700 to 1500 nm, and preferably from 750 to 1200 nm. Particularly preferred infrared laser sources are laser diodes emitting around 830 nm or NdYAG laser emitting around 1060 nm. The plate is exposed at a laser dosage that is sufficient to cause hardening in the exposed areas but not high enough to cause substantial thermal ablation. The exposure dosage is preferably from 1 to 2000 $mJ/cm^2$, more preferably from 5 to 1000 $mJ/cm^2$, most preferably from 30 to 500 $mJ/cm^2$, depending on the sensitivity of the thermosensitive layer.

The on-press developable plate is usually exposed on an exposure device, and then mounted on press to develop with ink and/or fountain solution and then print out regular printed sheets. However, the plate can also be exposed on a printing press cylinder, and the exposed plate can be directly developed on press with ink and/or fountain solution and then print out regular printed sheets. The solubilized or dispersed thermosensitive coating and/or overcoat can be mixed into the ink and/or the fountain solution on the rollers, and/or can be transferred to the blanket and then the initial printed medium (such as paper). The fountain solution roller is engaged (to the plate cylinder as for conventional inking system or to the ink roller as for integrated inking system) for preferably 0 to 100 rotations, more preferably 1 to 50 rotations and most preferably 5 to 20 rotations (of the plate cylinder), and the ink roller is then engaged to the plate cylinder for preferably 0 to 100 rotations, more preferably 1 to 50 rotations and most preferably 5 to 20 rotations before engaging the plate cylinder and feeding the receiving medium. Good quality prints should be obtained preferably under 40 initial impressions, more preferably under 20 impressions, and most preferably under 5 impressions. The plate may be rinsed or applied with an aqueous solution, including water and fountain solution, to remove the water soluble or dispersible overcoat (for plate with an overcoat) and/or to dampen without developing the plate, after imagewise exposure and before on-press development with ink and/or fountain solution.

For conventional wet press, usually fountain solution is applied (to contact the plate) first, followed by contacting with ink roller. For press with integrated inking/dampening system, the ink and fountain solution are emulsified by various press rollers before being transferred to the plate as emulsion of ink and fountain solution. However, in this invention, the ink and fountain solution may be applied at any combination or sequence, as needed for the plate. There is no particular limitation. The recently introduced single fluid ink that can be used for printing wet lithographic plate without the use of fountain solution, as described in for example U.S. Pat. No. 6,140,392, can also be used for the on-press development and printing of the on-press developable plate as well as for the printing of the aqueous developable plate of this invention.

The non-alkaline aqueous developer is an aqueous solution comprising 60–99% by weight of water and 0.5 to 40% by weight of an alcohol solvent and having a pH of 3.0 to 10.0. The alcohol solvent is defined as a water-soluble liquid organic compound having at least one hydroxyl group. The alcohol solvent must be soluble in water at the added concentration. Liquid alkyl alcohol (including arylalky alcohol) and its liquid derivatives are preferred alcohol solvents. Alcohol solvents useful for the developer of this invention include, for example, various liquid water-soluble alkyl alcohol, arylalkyl alcohol, alkoxyalkyl alcohol, arylalkoxyalkyl alcohol, aroxyalkyl alcohol, oxydialkanol, and alkyl lactate. Other functional group, such as ester, ether, epoxy, or ethylenic group, may be attached to the alkyl or aryl group. Examples of useful alcohol solvents are benzyl alcohol, phenethyl alcohol, isopropyl alcohol, 1-propyl alcohol, ethyl alcohol, butyl alcohol, ethyl lactate, propyl lactate, butyl lactate, methoxyethanol, ethoxyethanol, propoxyethanol, butoxyethanol, methoxypropanol, ethoxypropanol, propoxypropanol, butoxypropanol, diethylene glycol (2,2'-oxydiethanol), phenoxyethanol, and phenoxypropanol. For the alcohols with isomers, all liquid isomers can be used. Benzyl alcohol is a particularly useful alcohol solvent. Usually one alcohol solvent is used in the developer. However, two or more alcohol solvents can also be used in the same developer. The alcohol solvent is added preferably at 1 to 30% by weight of the developer and more preferably at 2 to 20%. The non-alkaline aqueous developer preferably has a pH of 3.0 to 10.0, more preferably 5.0 to 9.0, most preferably 6.0 to 8.0. While a pH of close to neutral (pH of about 7.0) is preferred, the pH may be slightly to moderately basic or acidic due to addition of certain additives for improving, for example, the hydrophilicity of the substrate. For example, phosphoric acid or citric acid may be added to improve the hydrophilicity of certain substrate; and small amount of diethanolamine may be added to adjust the pH to slightly basic to improve the hydrophilicity of certain substrate.

The alkaline aqueous developer is an aqueous solution comprising 60–99% by weight of water and 0.2 to 20% (preferably 0.5 to 10%) by weight of an alkaline compound and having a pH of preferably at least 9.0, more preferably from 10.0 to 14.0, and most preferably from 10.0 to 12.0. More than one alkaline compound can be used. Suitable alkaline compounds include inorganic alkaline compounds such as potassium silicate, sodium silicate, potassium hydroxide and sodium hydroxide, and organic amine compounds such as triethylamine, diethylamine, triethanolamine and diethanolamine.

Various surfactants can be added into the developer to, for example, help the wetting of the developer on the plate, improve the developability, reduce solid residue in the developer, and condition the bared substrate. Either ionic or nonionic water-soluble surfactant or both can be used. Examples of useful surfactants include polyethylene glycol, polypropylene glycol, and copolymer of ethylene glycol and propylene glycol, polysiloxane surfactants, ionic perfluorocarbon surfactants, nonionic perfluorocarbon surfactants, sodium dioctylsulfosuccinate, sodium dodecylbenzenesulfonate, sodium butylnaphthalenesulfonate, sodium alkylnaphthalenesulfonate, sodium cumenesulfonate, and ammonium laurylsulfonate. The surfactant is preferably added at from 0.01 to 20% by weight of the developer, more preferably from 0.1 to 10%, and most preferably from 1 to 5%. Various other additives, such as defoamer, bactericide, dye, and substrate conditioner (such as gum arabic, and maltodextrin), can be added. Certain salts, such as sodium chloride, potassium phosphate and ammonium sulfite, may be added to, for example, improve the hydrophilicity of the bared substrate.

The invention is further illustrated by the following non-limiting examples of its practice.

EXAMPLE 1–4

An electrochemically grained and anodized aluminum substrate was first coated with a 0.1% (by weight) aqueous solution of polyvinyl alcohol (Airvol 540, from Air Products) with a #6 Meyer rod to achieve a coverage of about 0.01 g/M$^2$, followed by drying in an oven at 90° C. for 2 min. The polyvinyl alcohol coated substrate was further coated with the thermosensitive layer formulation (PS-1, 2, 3, or 4 as listed in Table 1) with a #6 Meyer rod to achieve a coverage of about 1.1 g/m$^2$, followed by drying in an oven at 90° C. for 2 min.

TABLE 1

| Component | Weight (g) PS-1 | PS-2 | PS-3 | PS-4 |
|---|---|---|---|---|
| Neocryl B-728 (Polymer from Zeneca) | 2.84 | 2.64 | 2.84 | 2.84 |
| Sartomer CN975 (Hexafunctional urethane acrylate monomer from Sartomer Company) | 3.40 | 6.80 | — | 3.40 |
| Sartomer SR-399 (Pentafunctional non-urethane acrylate monomer from Sartomer Company) | 3.40 | — | 6.80 | — |
| Sartomer SR-349 (Difunctional non-urethane acrylate monomer from Sartomer Company) | — | — | — | 3.40 |
| (4-(2-Hydroxytetradecyl-oxy)phenyl)phenyliodonium hexafluoroantimonate | 1.98 | 1.98 | 1.98 | 1.98 |
| PINA KF-1151 (Infrared absorbing polymethine dye from Allied Signal) | 0.18 | 0.18 | 0.18 | 0.18 |
| Orasol Blue GN (Blue dye from Ciba-Geigy) | 0.20 | 0.20 | 0.20 | 0.20 |
| 2-Butanone | 88.00 | 88.00 | 88.00 | 88.00 |

Each of the thermosensitive layer coated plates was further coated with a water-soluble overcoat OC-1 using a #6 Meyer rod to achieve a coverage of about 1.5 g/m$^2$, followed by hot air blow drying and baking in an oven at 90° C. for 2 min.

OC-1

| Component | Weight ratios |
|---|---|
| Airvol 203 (Polyvinyl alcohol from Air Products) | 15.0 |
| Triton X-100 (Surfactant from Union Carbide) | 0.20 |
| Water | 85.0 |

The above coated plates (Plates 1, 2, 3 and 4, with PS-1, 2, 3 and 4, respectively) were exposed with an infrared laser imager equipped with laser diodes emitting at about 830 nm (Trendsetter from Creo) at a dosage of 250 mJ/cm$^2$. The exposed plates were developed with a non-alkaline aqueous developer containing about 6% by weight of benzyl alcohol, rinsed with water, and then inked up by wiping with a cloth soaked with fountain solution and ink. The test results are listed in Table 2. Plate 1 showed clearly better resolution than Plates 2–4.

TABLE 2

| Plate | Plate 1 | Plate 2 | Plate 3 | Plate 4 |
|---|---|---|---|---|
| Photosensitive layer | PS-1 | PS-2 | PS-3 | PS-4 |
| Inking | Good | Good | Good | Poor |
| Background | Clean | Clean | Clean | Clean |
| Highlight resolution | 2% | 6% | 6% | >20% |

EXAMPLE 5

An electrochemically grained and anodized aluminum substrate was first coated with a 0.05% (by weight) aqueous solution of polyvinyl alcohol (Airvol 540, from Air Products) with a #6 Meyer rod, followed by drying in an oven at 90° C. for 2 min. The polyvinyl alcohol coated substrate was further coated with the thermosensitive layer formulation PS-5 with a #8 Meyer rod, followed by drying in an oven at 90° C. for 2 min.

PS-5

| Component | Weight (g) |
|---|---|
| Neocryl B-728 (Polymer from Zeneca) | 2.74 |
| Ebecryl 220 (Blend of a hexafunctional aromatic acrylate monomer and a tetrafunctional non-urethane aliphatic acrylate monomer at a weight ratio of about 0.67, from UCB Chemicals) | 5.51 |
| Renol Blue B2G-HW (Blue pigment from Ciba-Geigy) | 0.50 |
| Pluronic L43 (Nonionic surfactant from BASF) | 0.10 |
| (4-(2-Hydroxytetradecyl-oxy)phenyl)phenyliodonium hexafluoroantimonate | 1.00 |
| PINA KF-1151 (Infrared absorbing polymethine dye from Allied Signal) | 0.15 |
| Methoxypropanol | 72.00 |
| 2-Butanone | 18.00 |

The thermosensitive layer coated plate was further coated with a water-soluble overcoat OC-2 using a #6 Meyer rod, followed by hot air blow drying and baking in an oven at 90° C. for 2 min.

OC-2

| Component | Weight ratios |
|---|---|
| Airvol 205 (Polyvinyl alcohol from Air Products) | 10.0 |
| Triton X-100 (Surfactant from Union Carbide) | 0.20 |
| Water | 90.0 |

The above coated plate was exposed with an infrared laser imager equipped with laser diodes emitting at about 830 nm (Trendsetter from Creo) at a dosage of 150 $mJ/cm^2$. The exposed plate was developed with a non-alkaline aqueous developer containing 3% by weight of benzyl alcohol, rinsed with water, gummed up with Viking Negative Plate Cleaner And Finisher (from 3M), and then printed on AB Dick 360 lithographic press. The plate gave good inking, clean background, and a resolution of 2–98%. The plate continued to run to 10,000 impressions without showing any wearing.

EXAMPLE 6

An electrochemically grained, anodized, and polyvinyl phosphonic acid treated aluminum substrate was coated with the thermosensitive layer formulation PS-6 with a #6 Meyer rod, followed by drying in an oven at 90° C. for 2 min.

PS-6

| Component | Weight (g) |
|---|---|
| Neocryl B-728 (Polymer from Zeneca) | 2.76 |
| Ebecryl 8301 (Blend of a hexafunctional aliphatic acrylate monomer and a hexafunctional non-urethane aliphatic acrylate monomer at a weight ratio of about 0.67, from UCB Chemicals) | 5.53 |
| Renol Blue B2G-HW (Blue pigment from Ciba-Geigy) | 0.50 |
| Pluronic L43 (Nonionic surfactant from BASF) | 0.10 |
| (4-(2-Hydroxytetradecyl-oxy)phenyl)phenyliodonium hexa-fluorophosphate | 1.01 |
| PINA KF-1151 (Infrared absorbing polymethine dye from Allied Signal) | 0.10 |
| Methoxypropanol | 72.00 |
| 2-Butanone | 18.00 |

The thermosensitive layer coated plate was further coated with a water-soluble overcoat OC-1 using a #6 Meyer rod, followed by hot air blow drying and baking in an oven at 90° C. for 2 min.

The above coated plate was exposed with an infrared laser imager equipped with laser diodes emitting at about 830 nm (Trendsetter from Creo) at a dosage of 200 $mJ/cm^2$. The exposed plate was developed with a non-alkaline aqueous developer containing 3% by weight of benzyl alcohol, rinsed with water, and then inked up with a cloth soaked with ink and fountain solution. The plate gave good inking, clean background, and a resolution of 2–98%.

EXAMPLE 7

An electrochemically grained and anodized aluminum substrate was first coated with a 0.4% (by weight) aqueous solution of polyvinyl alcohol (Airvol 540, from Air Products) with a #6 Meyer rod, followed by drying in an oven at 90° C. for 2 min. The polyvinyl alcohol coated substrate was further coated with the thermosensitive layer formulation PS-7 with a #8 Meyer rod, followed by drying in an oven at 90° C. for 2 min.

PS-7

| Component | Weight (g) |
|---|---|
| Neocryl B-728 (Polymer from Zeneca) | 2.50 |
| Ebecryl 220 (Blend of a hexafunctional aromatic acrylate monomer and a tetrafunctional non-urethene aliphatic acrylate monomer at a weight ratio of about 0.67, from UCB Chemicals) | 5.99 |
| Pluronic L43 (Nonionic surfactant from BASF) | 0.40 |
| (4-(2-Hydroxytetradecyl-oxy)phenyl)phenyliodonium hexa-fluorophosphate | 1.00 |
| PINA KF-1151 (Infrared absorbing polymethine dye from Allied Signal) | 0.10 |
| 2-Butanone | 90.00 |

The thermosensitive layer coated plate was further coated with a water-soluble overcoat OC-3 using a #6 Meyer rod, followed by hot air blow drying and baking in an oven at 90° C. for 2 min.

OC-3

| Component | Weight ratios |
|---|---|
| Airvol 203 (Polyvinyl alcohol from Air Products) | 5.0 |
| Triton X-100 (Surfactant from Union Carbide) | 0.12 |
| Silwet 7604 (Surfactant from Union Carbide) | 0.02 |
| Water | 95.0 |

The above coated plate was exposed with an infrared laser imager equipped with laser diodes emitting at about 830 nm (Trendsetter from Creo) at a dosage of 200 $mJ/cm^2$. The exposed plate was directly mounted on the plate cylinder of a lithographic press (AB Dick 360) for on-press development. The press was started for 20 rotations (with the fountain roller on), and the ink roller (carrying emulsion of ink and fountain solution) was then engaged to the plate cylinder to rotate for 20 rotations (of the plate cylinder). The plate cylinder was then engaged with the blanket cylinder and printed with papers. The printed sheets showed good inking, clean background, and 2–98% resolution under 10 impressions. The plate continued to run for a total of 1000 impressions without showing any wearing (The press stopped at 1000 impressions.).

EXAMPLE 8

An electrochemically grained, anodized, and polyvinyl phosphonic acid treated aluminum substrate was first coated with a 0.1% (by weight) aqueous solution of polyvinyl alcohol (Airvol 540, from Air Products) with a #6 Meyer rod, followed by drying in an oven at 90° C. for 2 min. The polyvinyl alcohol coated substrate was further coated with the thermosensitive layer formulation PS-8 with a #8 Meyer rod, followed by drying in an oven at 90° C. for 2 min.

PS-8

| Component | Weight (g) |
|---|---|
| Neocryl B-728 (Polymer from Zeneca) | 2.796 |
| Ebecryl 8301 (Blend of a hexafunctional aliphatic acrylate monomer and a hexafunctional non-urethane aliphatic acrylate monomer at a weight ratio of about 0.67, from UCB | 6.681 |

-continued

PS-8

| Component | Weight (g) |
|---|---|
| Chemicals) | |
| Pluronic L43 (Nonionic surfactant from BASF) | 0.531 |
| (4-Octyloxyphenyl)phenyliodonium hexafluoroantimonate | 1.812 |
| ADS-830AT (Infrared absorbing cyanine dye from American Dye Source) | 0.180 |
| 2-Butanone | 88.000 |

The thermosensitive layer coated plate was further coated with a water-soluble overcoat OC-4 using a #6 Meyer rod, followed by hot air blow drying and baking in an oven at 90° C. for 2 min.

OC-4

| Component | Weight ratios |
|---|---|
| Airvol 203 (Polyvinyl alcohol from Air Products) | 10.00 |
| Triton X-100 (Surfactant from Union Carbide) | 0.14 |
| Silwet 7604 (Surfactant from Union Carbide) | 0.02 |
| Water | 90.0 |

The above coated plate was exposed with an infrared laser imager equipped with laser diodes emitting at about 830 nm (Trendsetter from Creo) at a dosage of 150 mJ/cm$^2$. The exposed plate was directly mounted on the plate cylinder of a lithographic press (Multilith Offset 1215) for on-press development. After starting the press, the fountain roller was engaged to the plate for 10 rotations (of the plate cylinder) and the ink roller was then engaged to the plate for 10 rotations (of the plate cylinder). The plate cylinder was then engaged with the blanket cylinder and printed with papers. The printed sheets showed good inking, clean background, and 2–98% resolution under 5 impressions. The plate continued to run for a total of 1000 impressions without showing any wearing (The press stopped at 1000 impressions.).

An electrochemically grained and anodized aluminum substrate was coated with the thermosensitive layer formulation PS-9 with a #8 Meyer rod, followed by drying in an oven at 90° C. for 2 min.

EXAMPLE 9

PS-9

| Component | Weight (g) |
|---|---|
| Carboset 527 (Polymer with acid number of 80 mg KOH/g, from B. F. Goodrich) | 2.74 |
| Ebecryl 220 (Blend of a hexafunctional aromatic acrylate monomer and a tetrafunctional non-urethane aliphatic acrylate monomer at a weight ratio of about 0.67, from UCB Chemicals) | 5.51 |
| Renol Blue B2G-HW (Blue pigment from Ciba-Geigy) | 0.50 |
| Pluronic L43 (Nonionic surfactant from BASF) | 0.10 |
| (4-(2-Hydroxytetradecyl-oxy)phenyl)phenyliodonium hexafluoroantimonate | 1.00 |
| PINA KF-1151 (Infrared absorbing polymethine dye from Allied Signal) | 0.15 |
| Methoxypropanol | 72.00 |
| 2-Butanone | 18.00 |

The thermosensitive layer coated plate was further coated with a water-soluble overcoat OC-1 using a #6 Meyer rod, followed by hot air blow drying and baking in an oven at 90° C. for 2 min.

The above coated plate was exposed with an infrared laser imager equipped with laser diodes emitting at about 830 nm (Trendsetter from Creo) at a dosage of 150 mJ/cm$^2$. The exposed plate was developed with an alkaline aqueous developer containing potassium silicate (1.5% weight) and surfactants, rinsed with water, gummed up with Viking Negative Plate Cleaner And Finisher (from 3M), and then printed on an AB Dick 360 lithographic press. The plate gave good inking, clean background, and a resolution of 2–98%. The plate continued to run for a total of 1000 impressions without showing any wearing (The press stopped at 1000 impressions.).

I claim:

1. A method of processing a lithographic printing plate comprising in order:

(a) providing a lithographic printing plate comprising (i) a hydrophilic substrate, and (ii) an oleophilic thermosensitive layer comprising a polymeric binder, a urethane (meth)acrylate monomer having at least 6 (meth)acrylate groups, a non-urethane (meth)acrylate monomer having at least 4 (meth)acrylate groups, a free-radical initiator, and an infrared absorbing dye; wherein the weight ratio of said urethane (meth) acrylate monomer to said non-urethane (meth)acrylate monomer is from 0.10 to 3.0; and (b) exposing said plate with said infrared laser according to digital imaging information to cause hardening of the thermosensitive layer in the exposed areas.

2. The method of claim 1 wherein said weight ratio of the urethane (meth)acrylate monomer to the non-urethane (meth)acrylate monomer is from 0.15 to 2.0.

3. The method of claim 1 wherein said weight ratio of the urethane (meth)acrylate monomer to the non-urethane (meth)acrylate monomer is from 0.20 to 1.5.

4. The method of claim 1 wherein said weight ratio of the urethane (meth)acrylate monomer to the non-urethane (meth)acrylate monomer is from 0.30 to 1.0.

5. The method of claim 1 wherein said urethane (meth) acrylate monomer has 6 acrylate groups.

6. The method of claim 1 wherein said urethane (meth) acrylate monomer is an aromatic urethane acrylate monomer.

7. The method of claim 1 wherein said urethane (meth) acrylate monomer is an aliphatic urethane acrylate monomer.

8. The method of claim 1 wherein said urethane (meth) acrylate monomer is solid at 25° C. and said non-urethane (meth)acrylate monomer is liquid at 25° C.

9. The method of claim 1 wherein said thermosensitive layer is semisolid at 25° C.

10. The method of claim 1 wherein said thermosensitive layer has a monomer to polymer weight ratio of larger than 1.5.

11. The method of claim 1 wherein said thermosensitive layer has a monomer to polymer weight ratio of larger than 2.0.

12. The method of claim 1 wherein said plate further includes a water soluble interlayer interposed between the substrate and the thermosensitive layer; wherein the substrate comprises rough and/or porous surface capable of mechanical interlocking with a coating deposited thereon, and the interlayer is substantially conformally coated on the microscopic surfaces of the substrate and is thin enough in thickness, to allow bonding between the thermosensitive layer and the substrate through mechanical interlocking.

13. The method of claim 1 wherein said plate further includes a water soluble or dispersible overcoat on the thermosensitive layer.

14. The method of claim 1 wherein said plate is further developed with an aqueous developer comprising 1 to 40% by weight of an alcohol solvent and 60 to 99% by weight of water, said alcohol solvent being a water-soluble organic solvent having at least one hydroxyl group.

15. The method of claim 1 wherein said polymeric binder is soluble in an alkaline aqueous solution and said plate is further developed with an alkaline aqueous developer.

16. The method of claim 1 wherein said thermosensitive layer is soluble or dispersible in ink and/or fountain solution and said plate is further developed on press with ink and/or fountain solution.

17. The method of claim 1 wherein said thermosensitive layer is soluble or dispersible in ink and/or fountain solution and said plate is imagewise exposed with said infrared laser while mounted on the plate cylinder of a lithographic press and then on-press developed with ink and/or fountain solution.

18. A method of processing a lithographic printing plate comprising in order:

(a) providing a lithographic printing plate comprising (i) a hydrophilic substrate, (ii) an oleophilic thermosensitive layer comprising a polymeric binder, a urethane (meth)acrylate monomer having at least 6 (meth) acrylate groups, a non-urethane (meth)acrylate monomer having at least 4 (meth)acrylate groups, a free-radical initiator, and an infrared absorbing dye, and (iii) a water soluble or dispersible overcoat; wherein the weight ratio of said urethane (meth)acrylate monomer to said non-urethane (meth)acrylate monomer is from 0.10 to 3.0, and said thermosensitive layer is soluble or dispersible in ink and/or fountain solution;

(b) exposing said plate with said infrared laser according to digital imaging information to cause hardening of the thermosensitive layer in the exposed areas; and (c) contacting said exposed plate with ink and fountain solution on a lithographic printing press to remove the overcoat and the non-hardened areas of the thermosensitive layer, and to lithographically print images from said plate to the receiving medium.

19. The method of claim 18 wherein said plate further includes a water soluble interlayer interposed between the substrate and the thermosensitive layer, wherein the substrate comprises rough and/or porous surface capable of mechanical interlocking with a coating deposited thereon, and the interlayer is substantially conformally coated on the microscopic surfaces of the substrate and is thin enough in thickness, to allow bonding between the thermosensitive layer and the substrate through mechanical interlocking.

20. The method of claim 18 wherein said plate is imagewise exposed with said infrared laser while mounted on the plate cylinder of said lithographic printing press.

21. A method of processing a lithographic printing plate comprising in order:

(a) providing a lithographic printing plate comprising (i) a hydrophilic substrate, (ii) an oleophilic thermosensitive layer comprising a polymeric binder, a urethane (meth)acrylate monomer having at least 6 (meth) acrylate groups, a non-urethane (meth)acrylate monomer having at least 4 (meth)acrylate groups, a free-radical initiator, and an infrared absorbing dye, and (iii) a water soluble or dispersible overcoat; wherein the weight ratio of said urethane (meth)acrylate monomer to said non-urethane (methacrylate monomer is from 0.10 to 3.0;

(b) exposing said plate with said infrared laser according to digital imaging information to cause hardening of the thermosensitive layer in the exposed areas; and (c) developing said plate with an aqeuous developer to remove the overcoat and the non-hardened areas of the thermosensitive layer.

22. The method of claim 21 wherein said aqueous developer comprises 1 to 40% by weight of an alcohol solvent and 60 to 99% by weight of water, and has a pH of 4.0 to 10.0, said alcohol solvent being a water-soluble organic solvent having at least one hydroxyl group.

23. The method of claim 21 wherein said polymeric binder is soluble in an alkaline aqueous solution, and said aqueous developer is an alkaline aqueous developer having a pH of from 10.0 to 14.0.

24. A lithographic printing plate comprising (i) a hydrophilic substrate, (ii) an oleophilic thermosensitive layer comprising a polymeric binder, a urethane (meth)acrylate monomer having at least 6 (meth)acrylate groups, a non-urethane (meth)acrylate monomer having at least 4 (meth) acrylate groups, a free-radical initiator, and an infrared absorbing dye, and (iii) a water soluble or dispersible overcoat; wherein the weight ratio of said urethane (meth) acrylate monomer to said non-urethane (meth)acrylate monomer is from 0.10 to 3.0, and said thermosensitive layer is capable of hardening upon exposure to an infrared laser.

* * * * *